(12) United States Patent
Hung et al.

(10) Patent No.: US 12,717,369 B2
(45) Date of Patent: Aug. 25, 2026

(54) VOLTAGE REGULATORS WITH SHARED DECOUPLING CAPACITOR FOR MEMORY DEVICES

(71) Applicant: Taiwan Semiconductor Manufacturing Company, Ltd., Hsinchu (TW)

(72) Inventors: Chen-Ming Hung, Hsinchu (TW); Chung-Cheng Chou, Hsinchu (TW); Zheng-Jun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 207 days.

(21) Appl. No.: 18/331,620

(22) Filed: Jun. 8, 2023

(65) Prior Publication Data

US 2024/0411334 A1 Dec. 12, 2024

(51) Int. Cl.
*G05F 1/59* (2006.01)
*G11C 11/16* (2006.01)
*G11C 13/00* (2006.01)

(52) U.S. Cl.
CPC ............ *G05F 1/59* (2013.01); *G11C 11/1697* (2013.01); *G11C 13/0038* (2013.01)

(58) Field of Classification Search
CPC .... G05F 1/59; G11C 11/1697; G11C 13/0038
See application file for complete search history.

(56) References Cited

U.S. PATENT DOCUMENTS 6,072,740 A * 6/2000 Borkar ..................... G11C 5/14 365/206
10,423,178 B1 * 9/2019 Chen ......................... G05F 1/56
2020/0304112 A1 * 9/2020 Zhang .................. H02H 1/0007
2023/0393639 A1 * 12/2023 Gunther ................ G06F 1/3212

FOREIGN PATENT DOCUMENTS

EP 3508943 A1 * 7/2019 ............... G05F 1/46
JP 2004348810 A * 12/2004 ........... H10D 64/037
JP 5298895 B2 * 9/2013

OTHER PUBLICATIONS

Power Management System and Method Therefor (Year: 2018).*
D / A Converter (Year: 2009).*

* cited by examiner

*Primary Examiner* — Sultana Begum
(74) *Attorney, Agent, or Firm* — Foley & Lardner LLP

(57) ABSTRACT

A circuit includes a memory macro comprising a plurality of memory banks. The circuit includes a first voltage regulator configured to provide a first operation voltage to the memory macro at a first output node. The circuit includes a second voltage regulator configured to provide a second operation voltage to the memory macro at a second output node. The second operation voltage is substantially higher than the first operation voltage. The circuit includes a decoupling capacitor configured to be alternately shared by the first voltage regulator when the memory macro receives the first operation voltage, and by the second voltage regulator when the memory macro receives the second operation voltage.

20 Claims, 15 Drawing Sheets

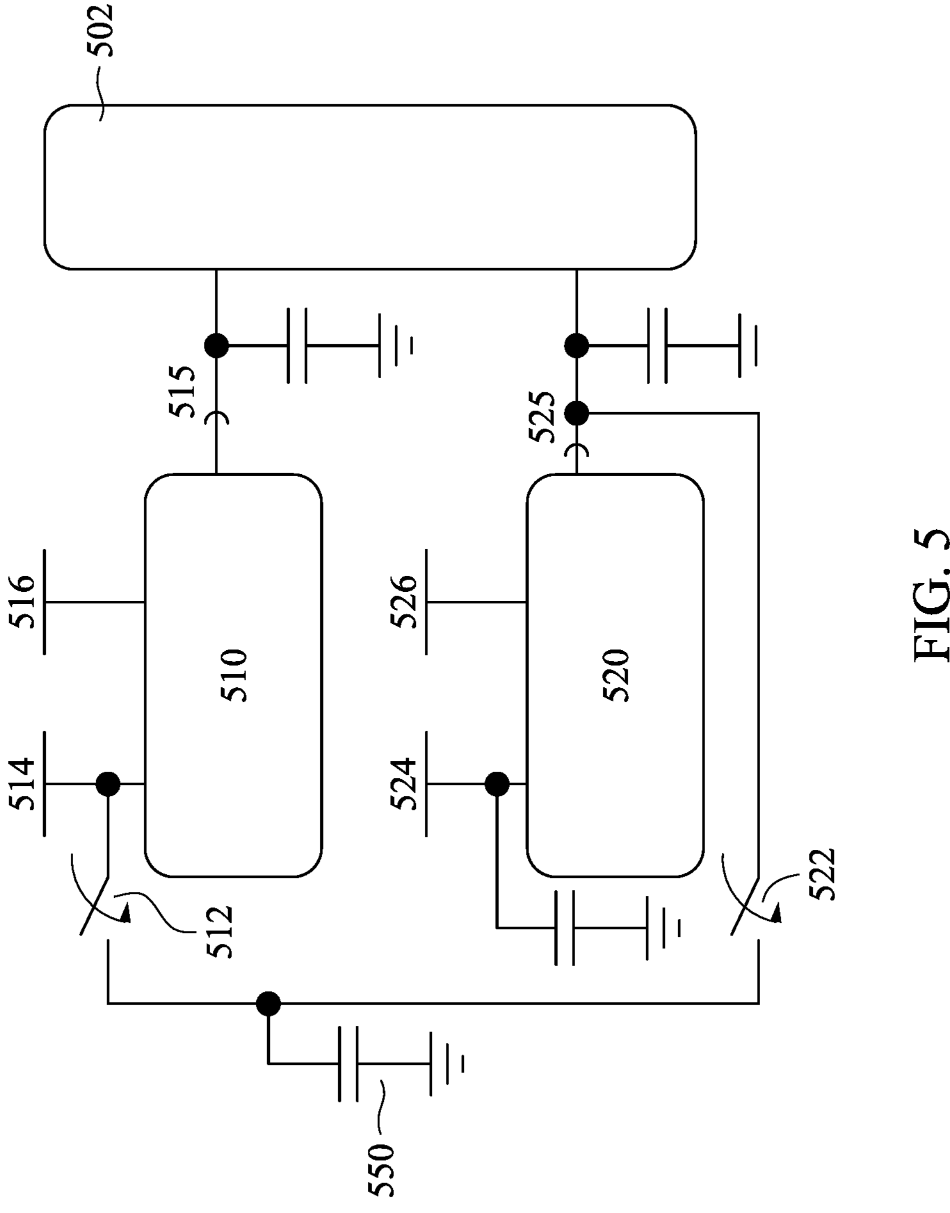
FIG. 5

VOLTAGE REGULATORS WITH SHARED DECOUPLING CAPACITOR FOR MEMORY DEVICES

BACKGROUND

A voltage regulator, e.g., a low-dropout (LDO) voltage regulator, is typically used to provide a well-specified and stable direct-current (DC) voltage. Generally, an LDO voltage regulator is characterized by its low dropout voltage, which refers to a small difference between respective input voltage and output voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates an example block diagram of yet another memory device, in accordance with some embodiments.

DETAILED DESCRIPTION

Figure 1:
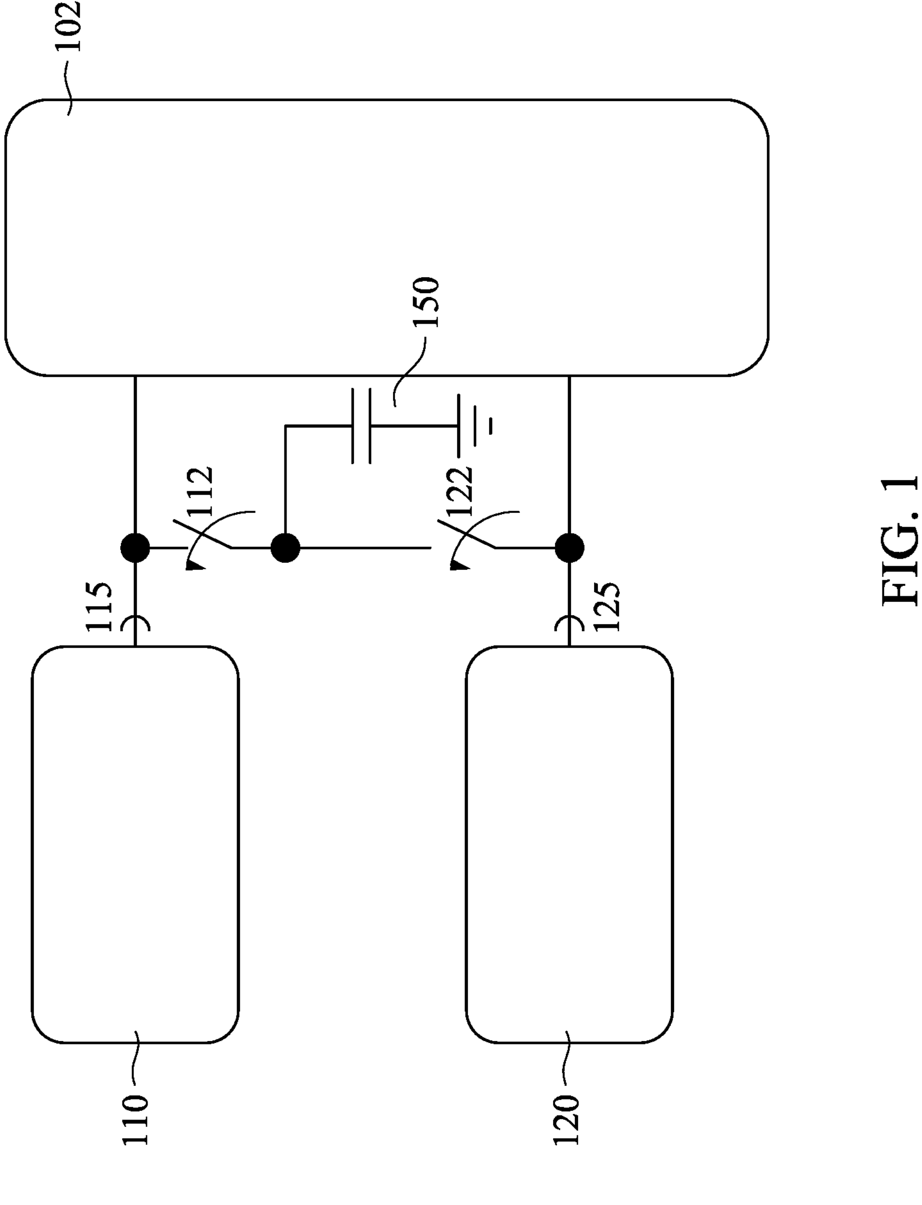
FIG. 1 illustrates an example block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a low-dropout (LDO) voltage regulator is configured to provide a well-specified and stable direct-current (DC) output voltage (e.g., a regulated output voltage) based on an input voltage (e.g., an unregulated input voltage) with a low dropout voltage. The "dropout voltage" used herein typically refers to a minimum voltage required across the LDO regulator to maintain the output voltage being regulated. Even though the input voltage, provided by a power source, falls to a level very near that of the output voltage and the input voltage is unregulated, the LDO voltage regulator can still produce the output voltage that is regulated and stable. Such a stable characteristic enables the LDO voltage regulator to be used in a variety of integrated circuit (IC) applications, for example, a memory device, a power IC device, etc.

In order to save area, a shared and centralized LDO voltage regulator is commonly adopted for one or more memory macros. Coupled to the LDO voltage regulator, a decoupling capacitor can prevent electrical energy from transferring from one part of a circuit to another. As a density of memory banks in the memory macro decreases (e.g., a number of memory banks in each memory macro decreases from 32 Mb to 8 Mb) for certain applications, the percentage of an area occupied by the decoupling capacitor over a total area of the memory macro can significantly increase, which can disadvantageously limit the application of the memory macro. In this regard, it has been proposed to separate the LDO voltage regulator into multiple voltage regulators, each of which is configured to provide a respective operation voltage to operate the memory macro and is coupled to a respective decoupling capacitor. However, in order to provide sufficiently large decoupling capacitance, a total area of these different decoupling capacitors may still remain large.

Thus, the memory device, with the existing configuration of voltage regulator(s) and decoupling capacitor(s), has not been entirely satisfactory in many aspects.

The present disclosure provides various embodiments of a memory device that includes a memory macro operatively coupled to a first voltage regulator and a second voltage regulator. For example, the memory macro includes a plural number of memory banks, each of the memory banks including one or more memory arrays, and each of the memory array including a plural number of memory cells. As a non-limiting example, the memory cells can each be implemented as a resistive random access memory (RRAM) cell or any of various other types of a memory cell that operates under at least two different modes (e.g., at least two voltage levels). The first voltage regulator can regulate, generate, or otherwise provide a first operation voltage (e.g., a write/program voltage) to the memory macro, when the memory macro is configured at a first operation mode (e.g., a write mode); and the second can regulate, generate, or otherwise provide a second operation voltage (e.g., a read/standby voltage) to the memory macro, when the memory macro is configured at a second operation mode (e.g., a read/standby mode). At the first operation mode, the first voltage regulator is coupled to the memory macro, with a shared decoupling capacitor coupling the first voltage regulator to ground. At the second operation mode (e.g., subsequently to or prior to the first operation mode being configured), the second voltage regulator is coupled to the memory macro, with the shared decoupling capacitor coupling the second voltage regulator to ground. In other words, the first voltage regulator and second voltage regulator are alternately coupled to the memory macro, with the shared decoupling capacitor coupling to the functional first or second voltage regulator. In this way, a sufficiently large decoupling capacitor can be operational (e.g., coupling to the first or second voltage regulator) whenever needed, while keeping a total area occupied by such a decoupling capacitor ideally small.

FIG. 1 illustrate a block diagram of an example memory device 100, in accordance with various embodiments. In some aspects of the present disclosure, the memory device 100 includes a plural number of voltage regulators (e.g., LDO voltage regulators) sharing a common decoupling capacitor. It should be understood that the block diagram of FIG. 1 is simplified, and thus, the memory device 100 can include any of various other components while remaining within the scope of the present disclosure.

For example, the memory device 100 includes a memory macro 102, a first voltage regulator 110, a second voltage regulator 120, a first switch 112, a second switch 122, and a shared decoupling capacitor 150. The memory macro 102 includes one or more memory banks, each of the memory banks including one or more memory arrays (or sub-arrays), and each of the memory arrays including a plural number of memory cells. In various embodiments, each of the memory cells is implemented as being applied with at least two voltage levels for respective operation modes. For example, the memory cell may be a resistive random access memory (RRAM) cell or a magnetoresistive random access memory (MRAM) cell that can be programmed (written) with a first operation voltage, or read with a second operation voltage. The first and second operation voltages are different from each other, e.g., a voltage level of the first operation voltage is substantially higher than a voltage level of the second operation voltage.

As such, the first voltage regulator 110 may provide (or otherwise output) a first operation voltage 115 to the memory macro 102 when it is configured in a first operation mode (e.g., write/program mode), and the second voltage regulator 120 may provide (or otherwise output) a second operation voltage 125 to the memory macro 102 when it is configured in a second operation mode (e.g., read/standby mode). In one aspect of the present disclosure, the first voltage regulator 110 can be selectively coupled to the decoupling capacitor 150 through the first switch 112, and the second voltage regulator 120 can be selectively coupled to the decoupling capacitor 150 through the second switch 122. The first switch 112 and second switch 122 can be alternately turned on/off, e.g., one of the first switch 112 or second switch 122 being turned on while the other of the first switch 112 or second switch 122 being turned off.

Alternatively stated, when the memory macro 102 is configured to operate with the first operation mode, the first voltage regulator 110 can provide the first operation voltage 115 to the memory macro 102, with the decoupling capacitor 150 coupling an output node of the first voltage regulator 110 to ground; and when the memory macro 102 is configured to operate with the second operation mode, the second voltage regulator 120 can provide the second operation voltage 125 to the memory macro 102, with the decoupling capacitor 150 coupling an output node of the second voltage regulator 120 to ground. When the decoupling capacitor 150 coupled to the respective output node of the first/second voltage regulator, the decoupling capacitor 150 can reduce ripples at the output node that may be due to load variations or noise interference.

Figure 2:
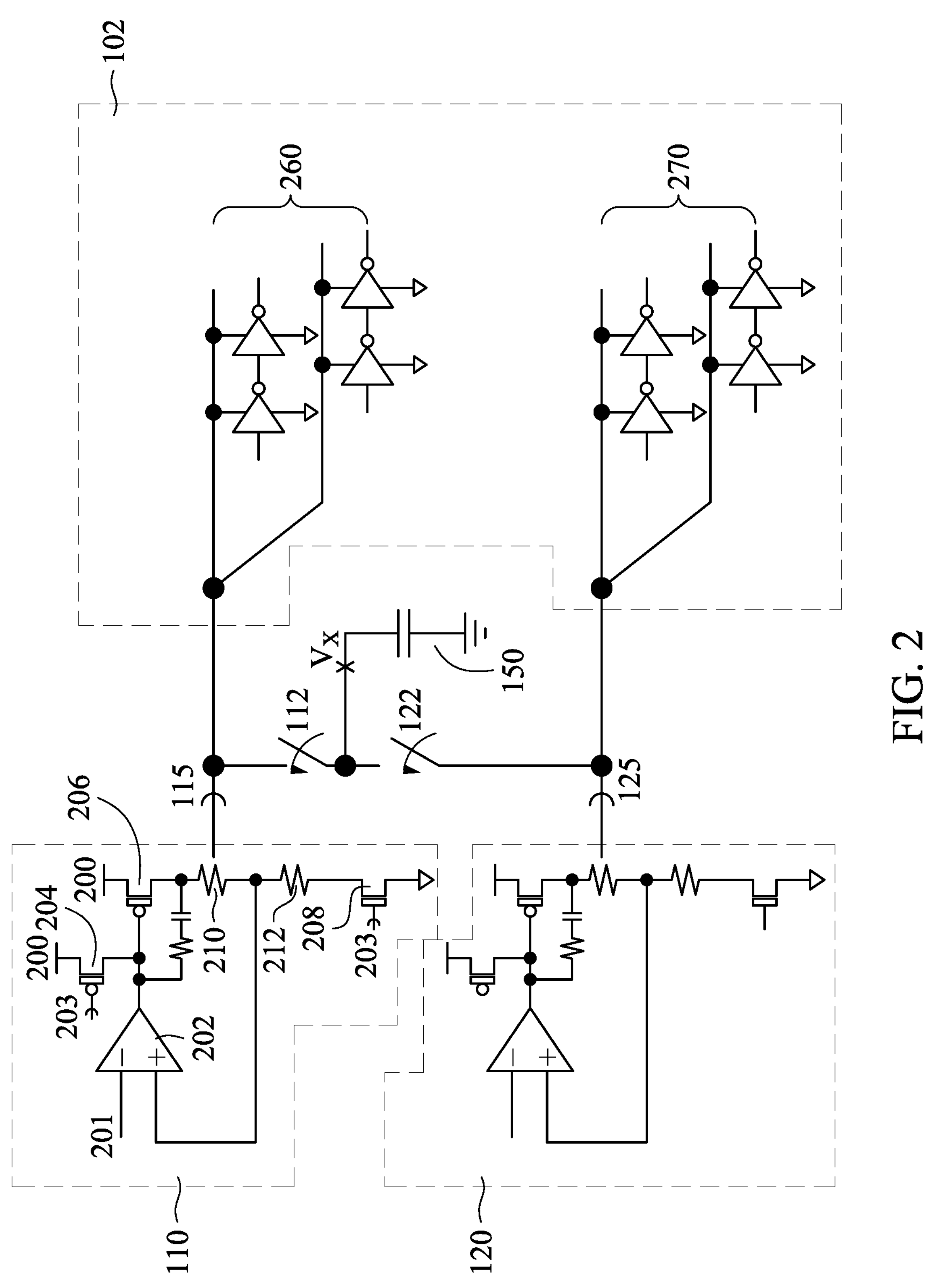
FIG. 2 illustrates an example circuit diagram of the memory device of FIG. 1, in accordance with some embodiments.

FIG. 2 illustrates an example circuit diagram of a portion of the memory device 100, in accordance with various embodiments. Using the first voltage regulator 110 as a representative example, the first voltage regulator 110, operated with a supply voltage 200, includes an amplifier 202, PMOS transistors 204 and 206, an NMOS transistor 208, and resistors 210 and 212. The amplifier 202 is an operational amplifier or an error amplifier. The amplifier 202 can receive a reference voltage 201 and a feedback signal from a node between the resistors 210 and 212 as inputs. The resistors 210 and 212 may collectively serve as a voltage divider for outputting the first operation voltage 115. The amplifier 202 can provide an output signal to gate the PMOS transistor 206, while the PMOS transistor 204 and the NMOS transistor 208 are gated by an enable signal. The PMOS transistor 204 and the NMOS transistor 208 may be alternately turned on, in some embodiments. When the enable signal is asserted, the first voltage regulator 110 may be activated, with PMOS transistor 204 turned off and the NMOS transistor 208 turned on. Further, the PMOS transistor 206 and the NMOS transistor 208 may serve as a pull-up transistor and a pull-down transistor of the first voltage regulator 110, respectively, to output the regulated first operation voltage 115. The second voltage regulator 120 can be substantially similar to the first voltage regulator 110, and thus, the description is not repeated.

As described above, with either the first operation voltage 115 or the second operation voltage 125 provided to the memory macro 102, the operation voltage can be provided to the memory macro 102 for a respective operation mode. For example, when the first operation voltage 115 is provided to the memory macro 102, one or more write drivers 260 may receive the first operation voltage 115 (e.g., as bit line signals) to perform respective write operations; and when the second operation voltage 125 is provided to the memory macro 102, one or more read drivers 270 may receive the second operation voltage 125 (e.g., as bit line signals) to perform respective read operations.

Figure 3:
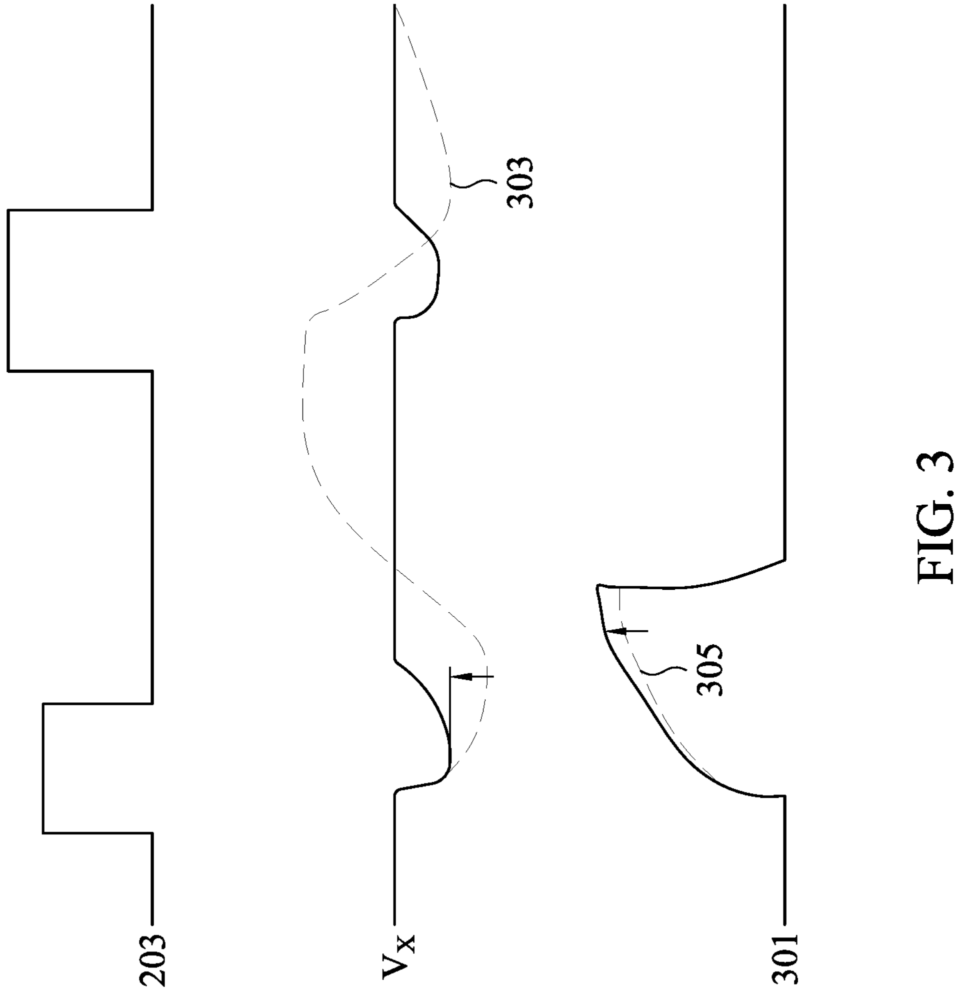
FIG. 3 illustrates waveforms of various signals operating the memory device of FIG. 1, in accordance with some embodiments.

FIG. 3 illustrates respective waveforms of various signals present by the memory device 100 over time, in accordance with various embodiments. For example, depicted are the waveforms of the enable signal 203, a signal received by the memory macro 102 (Vx), and a word line signal 301. As shown, when the enable signal 203 is pulled up to (logical) high, the first voltage regulator 110 is activated, which causing the first operation voltage 115 to be provided to the memory macro 102. Concurrently with or subsequently to the first voltage regulator 110 providing (outputting) the first operation voltage 115, the first switch 112 is turned on, which causes the decoupling capacitor 150 to couple the first operation voltage 115 to ground. Compared to dotted line 303 (where no such a shared decoupling capacitor 150 is present), a minimum voltage (or a maximum voltage droop) of the Vx can be significantly improved, e.g., the minimum voltage may increase from about 0.988 V to about 1.02 V. In other words, the maximum voltage droop can decrease by about 30 mV. With such an improved operation (write) voltage, e.g., Vx, provided to the memory macro 102, a rising time of the word line signal 301 can also be improved. Compared to dotted line 305 (again where no such a shared decoupling capacitor 150 is present), the rising time can be shorten from about 9 ns to about 7 ns.

Figure 4:
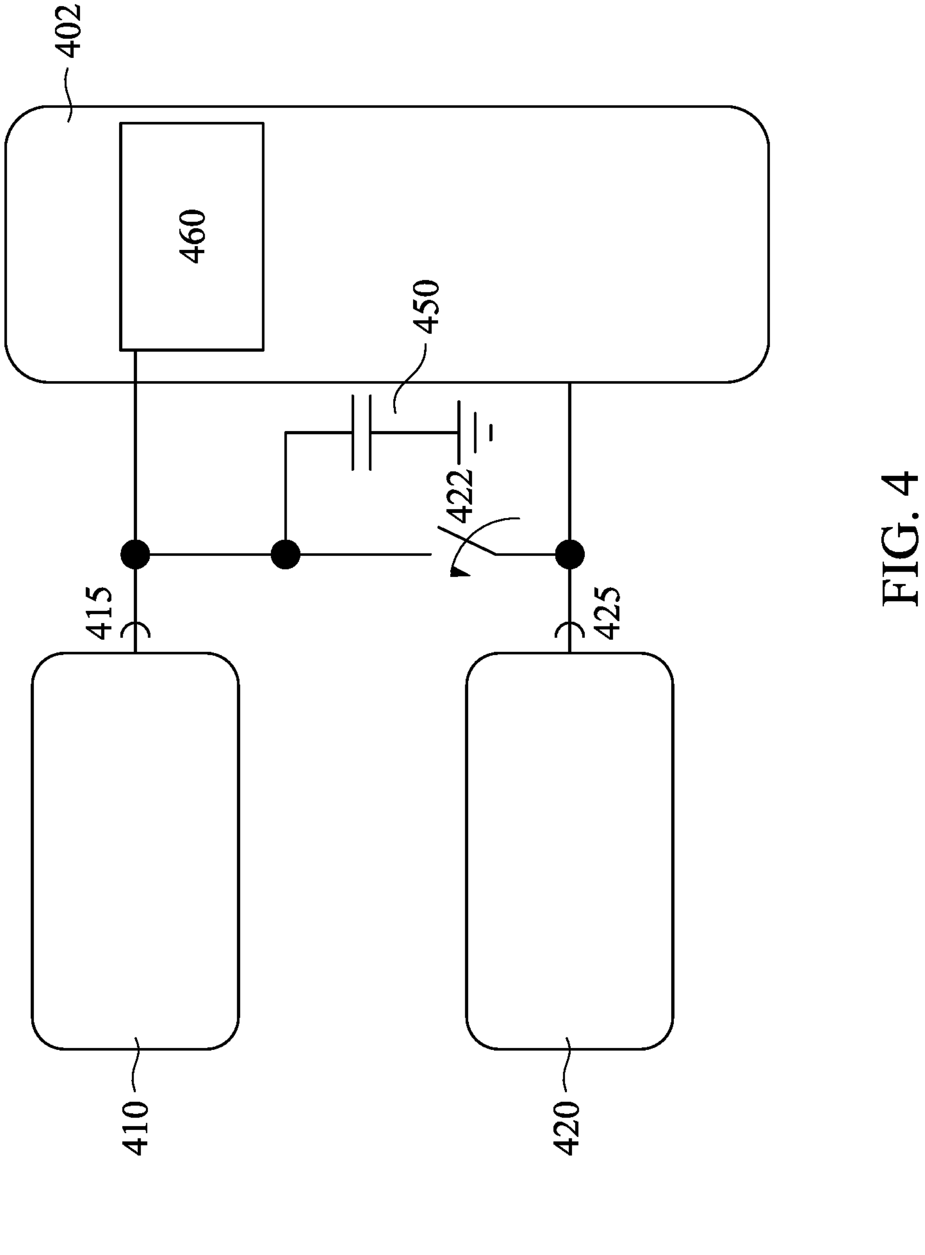
FIG. 4 illustrates an example block diagram of another memory device, in accordance with some embodiments.

FIG. 4 illustrate a block diagram of another example memory device 400, in accordance with various embodiments. In some aspects of the present disclosure, the memory device 400 includes a plural number of voltage regulators (e.g., LDO voltage regulators) sharing a common decoupling capacitor. The memory device 400 is substantially similar to the memory device 100 (FIG. 1), except that the memory device 400 includes only one switch configured to operatively couple one of its voltage regulators to a decoupling capacitor. It should be understood that the block diagram of FIG. 4 is simplified, and thus, the memory device 400 can include any of various other components while remaining within the scope of the present disclosure.

For example, the memory device 400 includes a memory macro 402, a first voltage regulator 410, a second voltage regulator 420, a switch 422, and a shared decoupling capacitor 450. The memory macro 402 includes one or more memory banks, each of the memory banks including one or more memory arrays (or sub-arrays), and each of the memory arrays including a plural number of memory cells. In various embodiments, each of the memory cells is implemented as being applied with at least two voltage levels for respective operation modes. For example, the memory cell may be a resistive random access memory (RRAM) cell or a magnetoresistive random access memory (MRAM) cell that can be programmed (written) with a first operation voltage, or read with a second operation voltage. The first and second operation voltages are different from each other, e.g., a voltage level of the first operation voltage is substantially higher than a voltage level of the second operation voltage.

As such, the first voltage regulator 410 may provide a first operation voltage 415 to the memory macro 402 when it is configured in a first operation mode (e.g., write/program mode), and the second voltage regulator 420 may provide a second operation voltage 425 to the memory macro 402 when it is configured in a second operation mode (e.g., read/standby mode). In one aspect of the present disclosure, the first voltage regulator 410 can be permanently coupled to the decoupling capacitor 450, while the second voltage regulator 420 can be selectively coupled to the decoupling capacitor 450 through the switch 422.

With such a configuration, when the memory macro 402 is configured to operate with the second operation mode, the second voltage regulator 410 can provide the second operation voltage 425 to the memory macro 402, with the decoupling capacitor 450 coupling an output node of the second voltage regulator 420 to ground. Further, during the second operation mode, a write block 460 of the memory macro 402 (e.g., write drivers) may be deactivated and the first voltage regulator 410 may also be activated. A high impedance may be present at an output node of the first voltage regulator 410. Even though the decoupling capacitor 450 is permanently coupled to the first voltage regulator 410 (as shown in FIG. 4), in the second operation mode, the decoupling capacitor 450 can still reduce ripples at an output node of the second voltage regulator 420. On the other hand, when the memory macro 402 is configured to operate with the first operation mode, the switch 422 may be turned off, thereby decoupling the decoupling capacitor 450 from the second voltage regulator 420.

FIG. 5 illustrate a block diagram of yet another example memory device 500, in accordance with various embodiments. In some aspects of the present disclosure, the memory device 500 includes a plural number of voltage regulators (e.g., LDO voltage regulators) sharing a common decoupling capacitor. The memory device 500 is substantially similar to the memory device 100 (FIG. 1), except that each of the voltage regulators of the memory device 500 is coupled to (e.g., powered by) two different supply voltages. It should be understood that the block diagram of FIG. 5 is simplified, and thus, the memory device 500 can include any of various other components while remaining within the scope of the present disclosure.

For example, the memory device 500 includes a memory macro 502, a first voltage regulator 510, a second voltage regulator 520, a first switch 512, a second switch 522, and a shared decoupling capacitor 550. The memory macro 502 includes one or more memory banks, each of the memory banks including one or more memory arrays (or sub-arrays), and each of the memory arrays including a plural number of memory cells. In various embodiments, each of the memory cells is implemented as being applied with at least two voltage levels for respective operation modes. For example, the memory cell may be a resistive random access memory (RRAM) cell or a magnetoresistive random access memory (MRAM) cell that can be programmed (written) with a first operation voltage, or read with a second operation voltage. The first and second operation voltages are different from each other, e.g., a voltage level of the first operation voltage is substantially higher than a voltage level of the second operation voltage.

In the embodiment of FIG. 5, the first voltage regulator 510 is powered by supply voltages 514 and 516; and the second voltage regulator 520 is powered by supply voltages 524 and 526. The supply voltage 514 is substantially larger than the supply voltage 516; and the supply voltage 524 is substantially larger than the supply voltage 526. In some embodiments, the supply voltages 514 and 524 are in a higher voltage domain, while the supply voltages 516 and 526 are in a lower voltage domain. For example, the supply voltage 514 and supply voltage 524 may power input/output (I/O) transistors of the first voltage regulator 510 and the second voltage regulator 520, respectively; and the supply voltage 516 and supply voltage 526 may power core transistors of the first voltage regulator 510 and the second voltage regulator 520, respectively. The term “I/O transistor” may refer to a transistor having a higher breakdown voltage, a higher threshold voltage, or being formed with a thicker gate dielectric, while the term "core transistor" may refer to a transistor having a lower breakdown voltage, a lower threshold voltage, or being formed with a thinner gate dielectric.

In some embodiments, the first switch 512 may selectively couple the supply voltage 514 to the decoupling capacitor 550; and the second switch 522 may selectively couple an output node of the second voltage regulator 520 to the decoupling capacitor 550. The first switch 512 and the second switch 522 may be alternately turned on. Specifically, the first switch 512 is turned on (i.e., coupling the supply voltage 514 to the decoupling capacitor 550), when the first voltage regulator 510 is activated to provide a first operation voltage 515 to the memory macro 502 (or when the memory macro 502 is configured to operate with a first operation (write) mode). The second switch 522 is turned on (i.e., coupling the output node of the second voltage regulator 520 to the decoupling capacitor 550), when the second voltage regulator 520 is activated to provide a second operation voltage 525 to the memory macro 502 (or when the memory macro 502 is configured to operate with a second operation (read) mode).

Figure 6:
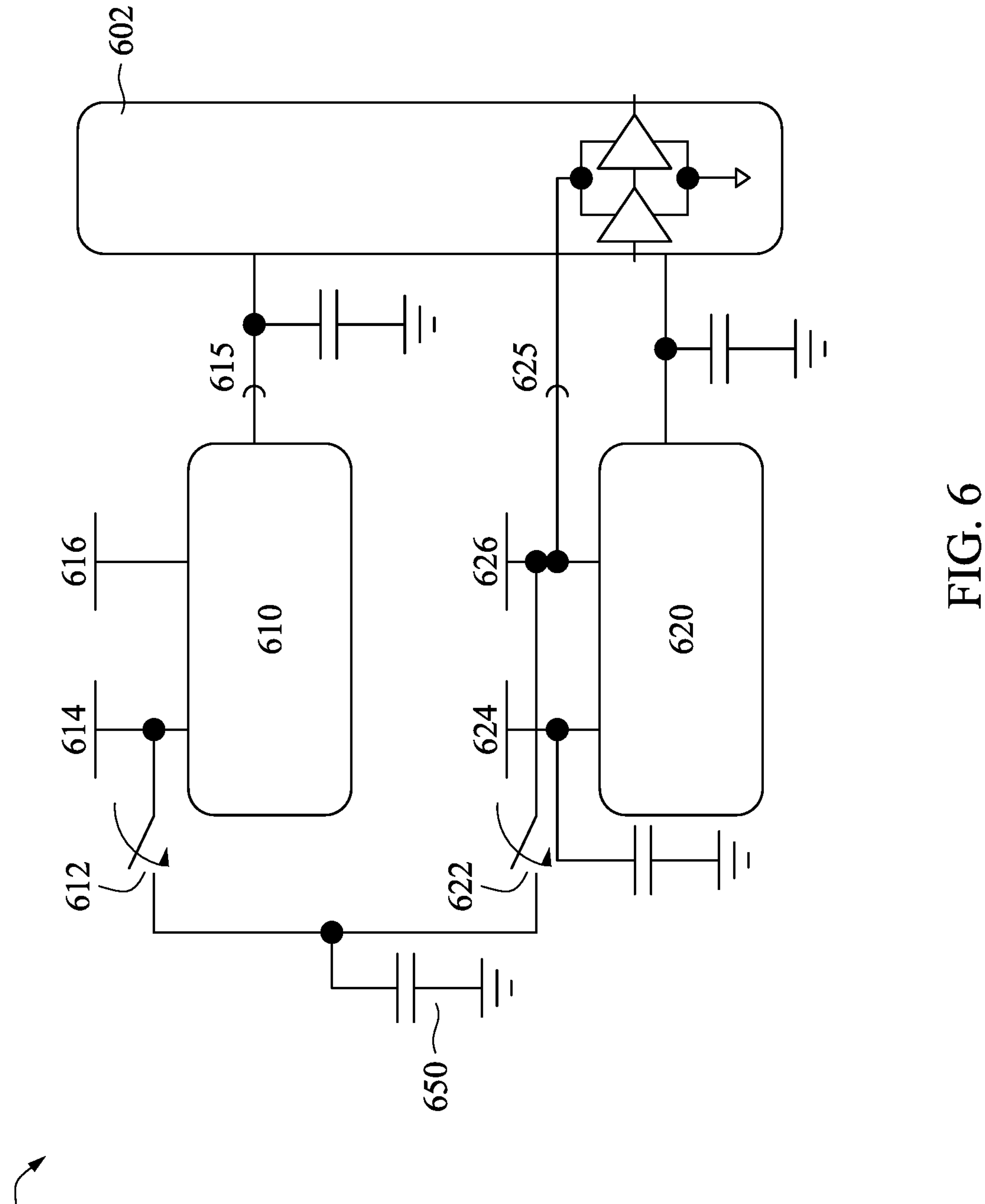
FIG. 6 illustrates an example block diagram of yet another memory device, in accordance with some embodiments.

FIG. 6 illustrate a block diagram of yet another example memory device 600, in accordance with various embodiments. In some aspects of the present disclosure, the memory device 600 includes a plural number of voltage regulators (e.g., LDO voltage regulators) sharing a common decoupling capacitor. The memory device 600 is substantially similar to the memory device 100 (FIG. 1), except that each of the voltage regulators of the memory device 600 is coupled to (e.g., powered by) two different supply voltages. It should be understood that the block diagram of FIG. 6 is simplified, and thus, the memory device 600 can include any of various other components while remaining within the scope of the present disclosure.

For example, the memory device 600 includes a memory macro 602, a first voltage regulator 610, a second voltage regulator 620, a first switch 612, a second switch 622, and a shared decoupling capacitor 650. The memory macro 602 includes one or more memory banks, each of the memory banks including one or more memory arrays (or sub-arrays), and each of the memory arrays including a plural number of memory cells. In various embodiments, each of the memory cells is implemented as being applied with at least two voltage levels for respective operation modes. For example, the memory cell may be a resistive random access memory (RRAM) cell or a magnetoresistive random access memory (MRAM) cell that can be programmed (written) with a first operation voltage, or read with a second operation voltage. The first and second operation voltages are different from each other, e.g., a voltage level of the first operation voltage is substantially higher than a voltage level of the second operation voltage.

In the embodiment of FIG. 6, the first voltage regulator 610 is powered by supply voltages 614 and 616; and the second voltage regulator 620 is powered by supply voltages 624 and 626. The supply voltage 614 is substantially larger than the supply voltage 616; and the supply voltage 624 is substantially larger than the supply voltage 626. In some embodiments, the supply voltages 614 and 624 are in a higher voltage domain, while the supply voltages 616 and 626 are in a lower voltage domain. For example, the supply voltage 614 and supply voltage 624 may power input/output (I/O) transistors of the first voltage regulator 610 and the second voltage regulator 620, respectively; and the supply voltage 616 and supply voltage 626 may power core transistors of the first voltage regulator 610 and the second voltage regulator 620, respectively. The term "I/O transistor" may refer to a transistor having a higher breakdown voltage, a higher threshold voltage, or being formed with a thicker gate dielectric, while the term "core transistor" may refer to a transistor having a lower breakdown voltage, a lower threshold voltage, or being formed with a thinner gate dielectric.

In some embodiments, the first switch 612 may selectively couple the supply voltage 614 to the decoupling capacitor 650; and the second switch 622 may selectively couple the supply voltage 626 to the decoupling capacitor 650. The first switch 612 and the second switch 622 may be alternately turned on. Specifically, the first switch 612 is turned on (i.e., coupling the supply voltage 614 to the decoupling capacitor 650), when the first voltage regulator 610 is activated to provide a first operation voltage 615 to the memory macro 602 (or when the memory macro 602 is configured to operate with a first operation (write) mode). The second switch 622 is turned on (i.e., coupling the supply voltage 626 to the decoupling capacitor 650), when the second voltage regulator 620 is activated to provide a second operation voltage 625 to the memory macro 602 (or when the memory macro 602 is configured to operate with a second operation (read) mode).

Figure 7:
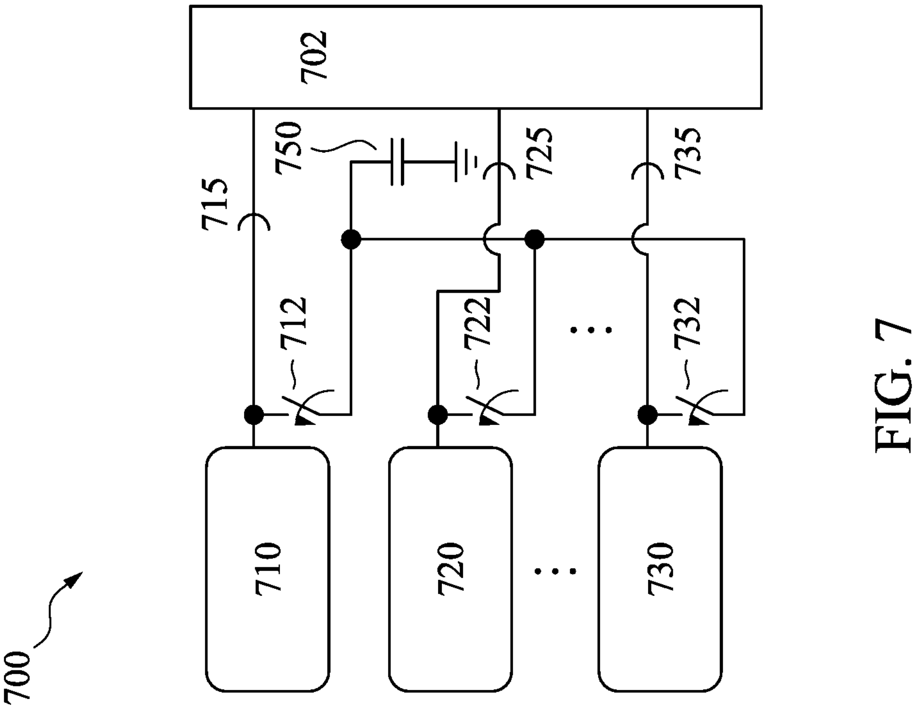
FIG. 7 illustrates an example block diagram of yet another memory device, in accordance with some embodiments.

FIG. 7 illustrate a block diagram of yet another example memory device 700, in accordance with various embodiments. In some aspects of the present disclosure, the memory device 700 includes a plural number of voltage regulators (e.g., LDO voltage regulators) sharing a common decoupling capacitor. The memory device 700 is substantially similar to the memory device 100 (FIG. 1), except that the memory device 700 includes more than 2 voltage regulators sharing a common decoupling capacitor. It should be understood that the block diagram of FIG. 7 is simplified, and thus, the memory device 700 can include any of various other components while remaining within the scope of the present disclosure.

For example, the memory device 700 includes a memory macro 702, a first voltage regulator 710, a second voltage regulator 720, a third voltage regulator 730, a first switch 712, a second switch 722, a third switch 732, and a shared decoupling capacitor 750. Although three voltage regulators (and a corresponding number of switches) are shown, it should be understood that the memory device 700 can include any number of the voltage regulators while remaining within the scope of the present disclosure. The memory macro 702 includes one or more memory banks, each of the memory banks including one or more memory arrays (or sub-arrays), and each of the memory arrays including a plural number of memory cells. In various embodiments, each of the memory cells is implemented as being applied with more than two voltage levels for respective operation modes. For example, the memory cell may be a resistive random access memory (RRAM) cell or a magnetoresistive random access memory (MRAM) cell that can be programmed (written) with a first operation voltage, read with a second operation voltage, or operated with a third operation voltage. The operation voltages are different from each other.

Figure 8:
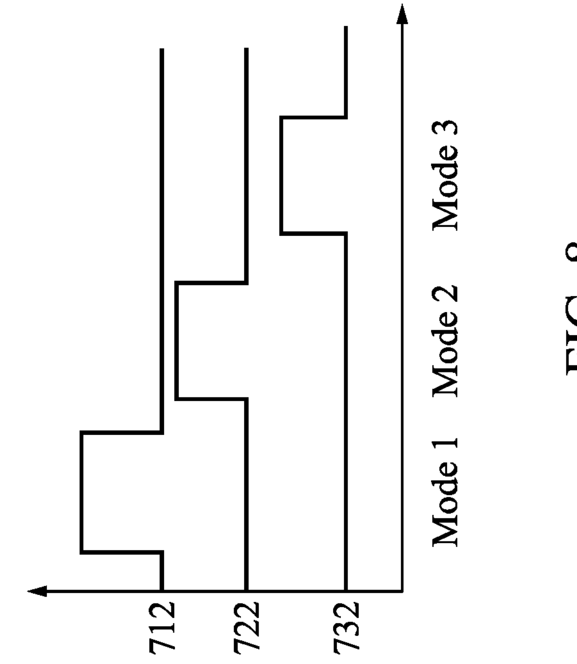
FIG. 8 illustrates waveforms of various signals operating the memory device of FIG. 7, in accordance with some embodiments.

In the embodiment of FIG. 7, when the memory macro 702 is configured to operate with a first operation mode, the first voltage regulator 710 can provide a first operation voltage 715 to the memory macro 702, with the decoupling capacitor 750 coupling an output node of the first voltage regulator 710 to ground; when the memory macro 702 is configured to operate with a second operation mode, the second voltage regulator 720 can provide a second operation voltage 725 to the memory macro 702, with the decoupling capacitor 750 coupling an output node of the second voltage regulator 720 to ground; and when the memory macro 702 is configured to operate with a third operation mode, the third voltage regulator 730 can provide a third operation voltage 735 to the memory macro 702, with the decoupling capacitor 750 coupling an output node of the third voltage regulator 730 to ground. Respective waveforms over time for example signals controlling the switches 712, 722, and 732 are illustrated in FIG. 8. As shown, the switches 712, 722, and 732 are sequentially turned on to couple the first voltage regulator 710, the second voltage regulator 720, and the third voltage regulator 730 to the memory macro 702, respectively. When the decoupling capacitor 750 coupled to the respective output node of the first/second/third voltage regulator, the decoupling capacitor 750 can reduce ripples at the output node that may be due to load variations or noise interference.

Figure 9:
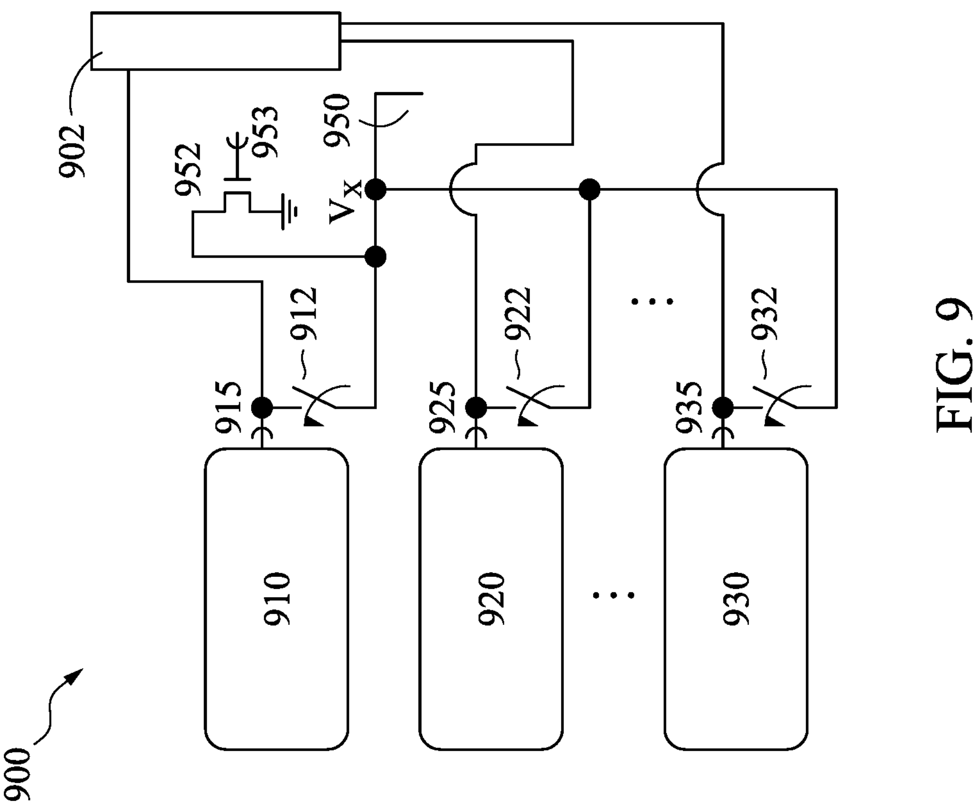
FIG. 9 illustrates an example block diagram of yet another memory device, in accordance with some embodiments.

FIG. 9 illustrate a block diagram of yet another example memory device 900, in accordance with various embodiments. In some aspects of the present disclosure, the memory device 900 includes a plural number of voltage regulators (e.g., LDO voltage regulators) sharing a common decoupling capacitor. The memory device 900 is substantially similar to the memory device 700 (FIG. 7), except that the memory device 900 further includes a reset logic. It should be understood that the block diagram of FIG. 9 is simplified, and thus, the memory device 900 can include any of various other components while remaining within the scope of the present disclosure.

For example, the memory device 900 includes a memory macro 902, a first voltage regulator 910, a second voltage regulator 920, a third voltage regulator 930, a first switch 912, a second switch 922, a third switch 932, and a shared decoupling capacitor 950. Although three voltage regulators (and a corresponding number of switches) are shown, it should be understood that the memory device 900 can include any number of the voltage regulators while remaining within the scope of the present disclosure. The memory macro 902 includes one or more memory banks, each of the memory banks including one or more memory arrays (or sub-arrays), and each of the memory arrays including a plural number of memory cells. In various embodiments, each of the memory cells is implemented as being applied with more than two voltage levels for respective operation modes. For example, the memory cell may be a resistive random access memory (RRAM) cell or a magnetoresistive random access memory (MRAM) cell that can be programmed (written) with a first operation voltage, read with a second operation voltage, or operated with a third operation voltage. The operation voltages are different from each other.

In the embodiment of FIG. 9, when the memory macro 902 is configured to operate with a first operation mode, the first voltage regulator 910 can provide a first operation voltage 915 to the memory macro 902, with the decoupling capacitor 950 coupling an output node of the first voltage regulator 910 to ground; when the memory macro 902 is configured to operate with a second operation mode, the second voltage regulator 920 can provide a second operation voltage 925 to the memory macro 902, with the decoupling capacitor 950 coupling an output node of the second voltage regulator 920 to ground; and when the memory macro 902 is configured to operate with a third operation mode, the third voltage regulator 930 can provide a third operation voltage 935 to the memory macro 902, with the decoupling capacitor 950 coupling an output node of the third voltage regulator 930 to ground.

Further, the memory device 900 includes a reset logic 952 coupled to one of the terminals of the decoupling capacitor 950. In some embodiments, the reset logic 952 may be activated to reset a signal received by the memory macro 902 (Vx) to a certain voltage during transition of different operation modes of the memory macro 902. For example in FIG. 9, the reset logic 952 is implemented as an NMOS transistor having a gate connected to (e.g., gated by) a control signal 953, a source connected to ground, and a drain connected to the decoupling capacitor 950 (and an output node of whichever activated voltage regulator). As such, when the reset logic 952 is activated (e.g., transitioning from the first operation mode to the second operation mode), the signal Vx may be pulled down to ground. By resetting the signal Vx, a voltage bump on the second operation voltage 925 (configured to be provided to the memory macro 902) can be significantly suppressed, which can advantageously reduce a voltage droop present on the signal Vx (i.e., the voltage received by the memory macro 902).

Figure 10:
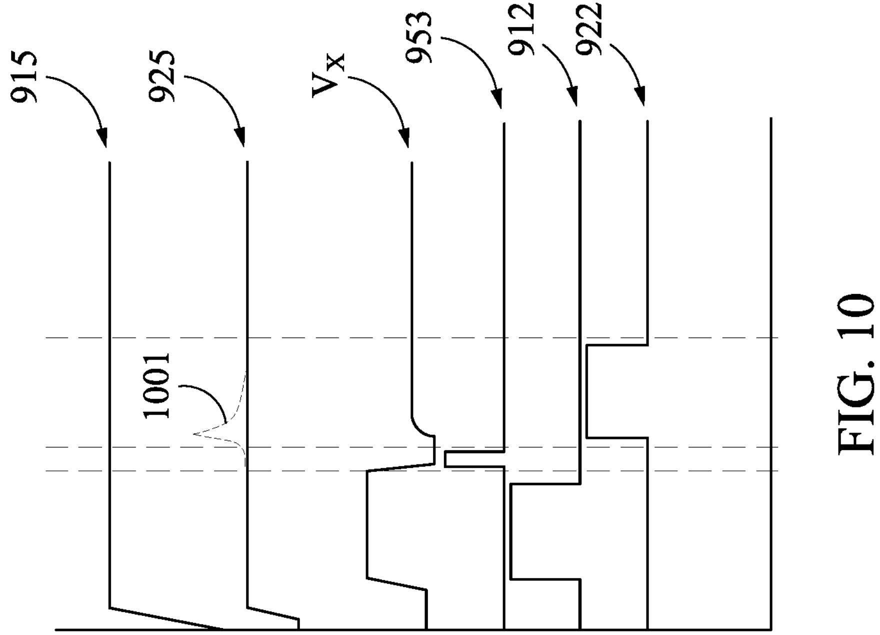
FIG. 10 illustrates waveforms of various signals operating the memory device of FIG. 9, in accordance with some embodiments.

Respective waveforms over time for the first operation voltage 915, the second operation voltage 925, the signal Vx, the control signal 953, and signals respectively controlling the switches 912 and 922 are illustrated in FIG. 10. As shown, during the transition from the first operation mode (the signal controlling the switch 912 pulled high) to the second operation mode (the signal controlling the switch 922 pulled high), the control signal 953 is pulled high to activate the reset logic 952. As such, the signal Vx can be pulled (e.g., reset) to ground through the activated reset logic 952, and accordingly, the second operation voltage 925 may remain relatively constant (compared to dotted line 1001 where there is no such a reset behavior).

Figure 12:
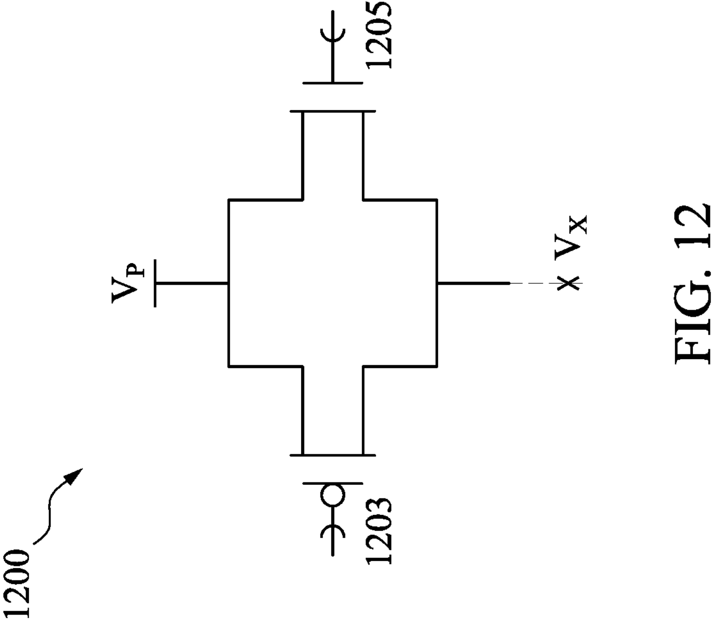
FIG. 11 and FIG. 12 illustrate example circuit diagrams of a reset logic of the memory device shown in FIG. 9, in accordance with some embodiments.
Figure 11:
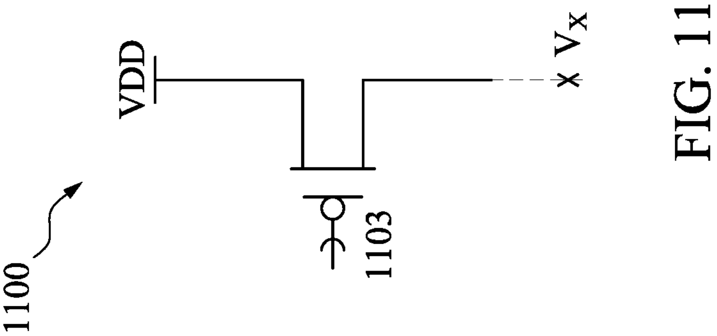

FIG. 11 and FIG. 12 respectively illustrate example circuit diagrams, 1100 and 1200, of other embodiments of the reset logic of the memory device 900 (FIG. 9). The embodiments of FIG. 11 and FIG. 12 are herein referred to as "reset logic 1100" and "reset logic 1200," respectively. In FIG. 11, the reset logic 1110 is implemented as a PMOS transistor having a gate connected to (e.g., gated by) a control signal 1103, a source connected to a supply voltage (e.g., VDD), and a drain connected to the decoupling capacitor 950 and an output node of whichever activated voltage regulator (e.g., outputting the signal Vx). In such a configuration, the signal Vx can be reset to VDD, when the reset logic 1100 is activated (through the enable signal 1103). In FIG. 12, the reset logic 1200 is implemented as a transmission gate that includes a PMOS transistor and an NMOS transistor. A gate of the PMOS transistor is connected to (e.g., gated by) a control signal 1203, a gate of the NMOS transistor is connected to (e.g., gated by) a control signal 1205 (logically inverse to the control signal 1203), respective sources/drains of the PMOS and NMOS transistors are connected to a predefined voltage $$\left(Vp, \text{ e.g., } \frac{1}{2}VDD\right),$$

and respective sources/drains of the PMOS and NMOS transistors are connected to the decoupling capacitor 950 and an output node of whichever activated voltage regulator (e.g., outputting the signal Vx). In such a configuration, the signal Vx can be reset to Vp, when the reset logic 1200 is activated (through the enable signals 1203 and 1205).

Figure 13:
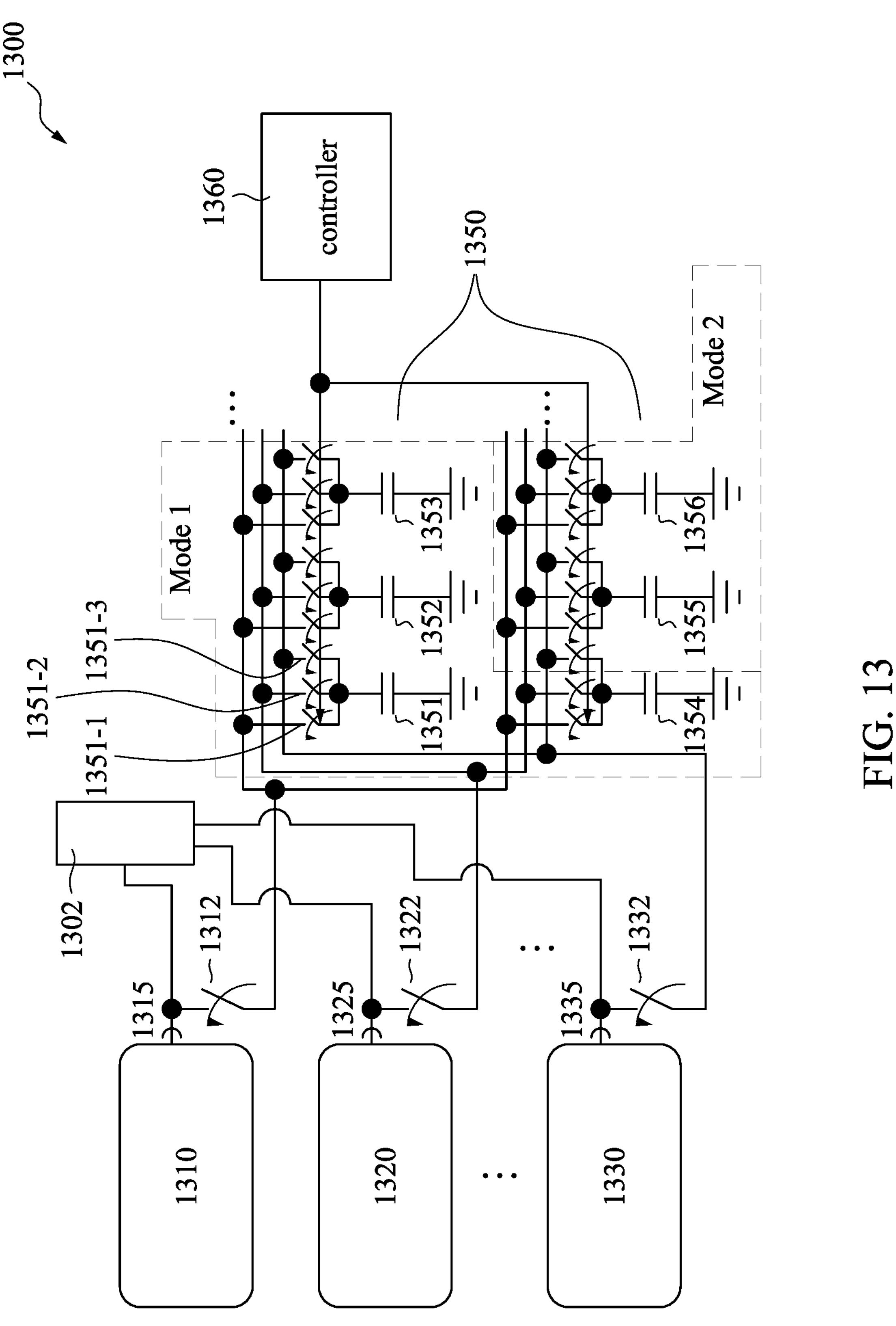
FIG. 13 illustrates an example block diagram of yet another memory device, in accordance with some embodiments.

FIG. 13 illustrate a block diagram of yet another example memory device 1300, in accordance with various embodiments. In some aspects of the present disclosure, the memory device 1300 includes a plural number of voltage regulators (e.g., LDO voltage regulators) sharing a common decoupling capacitor that has a configurable (e.g., codable or programmable) amount of capacitance. Specifically, the memory device 1300 is substantially similar to the memory device 700 (FIG. 7), except that the memory device 1300 further includes a controller that can individually control an amount of the decoupling capacitance for each operation mode of the corresponding memory macro, and further, different operation modes can share respective amounts of the decoupling capacitance at the same time. It should be understood that the block diagram of FIG. 13 is simplified, and thus, the memory device 1300 can include any of various other components while remaining within the scope of the present disclosure.

For example, the memory device 1300 includes a memory macro 1302, a first voltage regulator 1310, a second voltage regulator 1320, a third voltage regulator 1330, a first switch 1312, a second switch 1322, a third switch 1332, and a shared decoupling capacitor 1350 that includes a plural number of sub-capacitors, e.g., 1351, 1352, 1353, 1354, 1355, 1356, etc. Although three voltage regulators (and a corresponding number of switches) are shown, it should be understood that the memory device 1300 can include any number of the voltage regulators while remaining within the scope of the present disclosure. The memory macro 1302 includes one or more memory banks, each of the memory banks including one or more memory arrays (or sub-arrays), and each of the memory arrays including a plural number of memory cells. In various embodiments, each of the memory cells of the memory macro 1302 is implemented as being applied with more than two voltage levels for respective operation modes. For example, the memory cell of the memory macro 1302 may be a resistive random access memory (RRAM) cell or a magnetoresistive random access memory (MRAM) cell that can be programmed (written) with a first operation voltage, read with a second operation voltage, or operated with a third operation voltage. The operation voltages are different from each other.

In the embodiment of FIG. 13, each of the sub-capacitors 1351 to 1356 is coupled to three switches (e.g., 1351-1, 1351-2, and 1351-3) that correspond to the first, second, and third operation modes, respectively. A number of such switches can correspond to a number of the operation modes of the memory macro 1302. The memory device 1300 further includes a controller 1360 that can redistribute respective amounts of decoupling capacitance for different operation modes of the memory macro 1302 by controlling the three switches (hereinafter "first redistribution switch," "second redistribution switch," and "third redistribution switch"). When the memory macro 1302 is configured in a first operation mode, the first voltage regulator 1310 is activated and the first switch 1312 is turned on. The controller 1360 can control a number of the first redistribution switches to be turned on. When the memory macro 1302 is configured in a second operation mode, the second voltage regulator 1320 is activated and the second switch 1322 is turned on. The controller 1360 can control a number of the second redistribution switches to be turned on.

Figure 14:
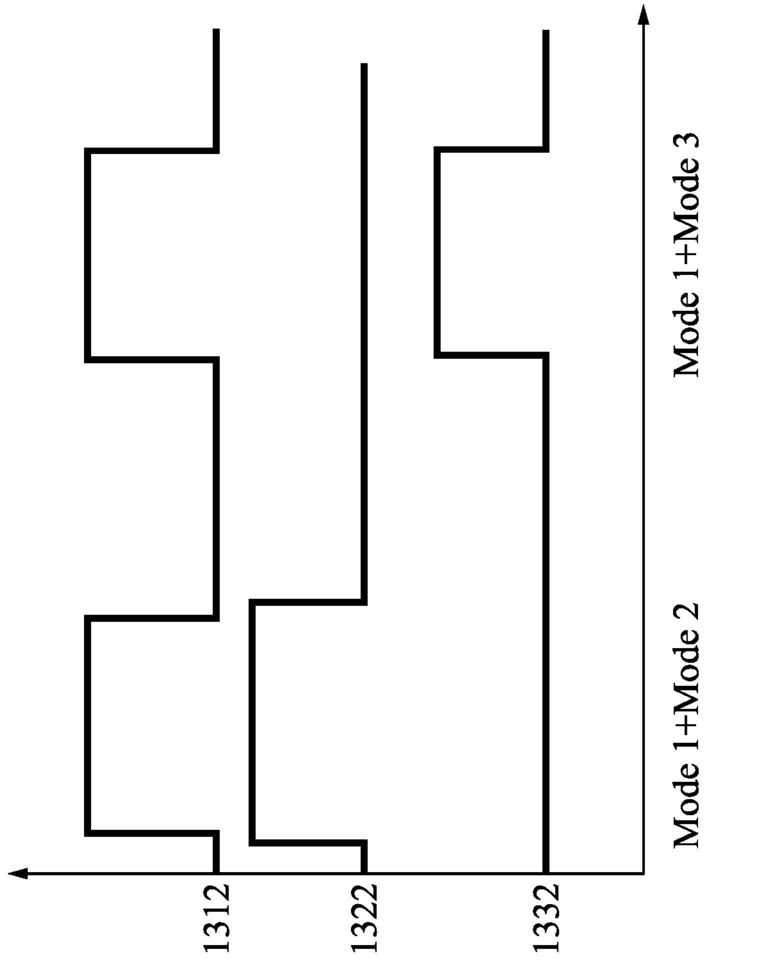
FIG. 14 illustrates waveforms of various signals operating the memory device of FIG. 13, in accordance with some embodiments.

For example in FIG. 13, the controller 1360 can turn on the first redistribution switches (and turn off the second and third redistribution switches) for the sub-capacitors 1351 to 1354 for coupling an output node of the first voltage regulator 1310 to ground through the sub-capacitors 1351 to 1354; and the controller 1360 can turn on the second redistribution switches (and turn off the first and third redistribution switches) for the sub-capacitors 1355 to 1356 for coupling an output node of the second voltage regulator 1320 to ground through the sub-capacitors 1355 to 1356. Further, with such a controller 1360 that can program the first to third redistribution switches for each sub-capacitor, the memory device 1300 can be configured with plural operation modes at the same time, as illustrated in FIG. 14. As shown, example waveforms of signals controlling the switches 1312, 1322, and 1332 are depicted. During a first period of time, the memory macro 1302 may be simultaneously operated with the first and second operation modes; and during a second period of time, the memory macro 1302 may be simultaneously operated with the first and third operation modes.

Figure 15:
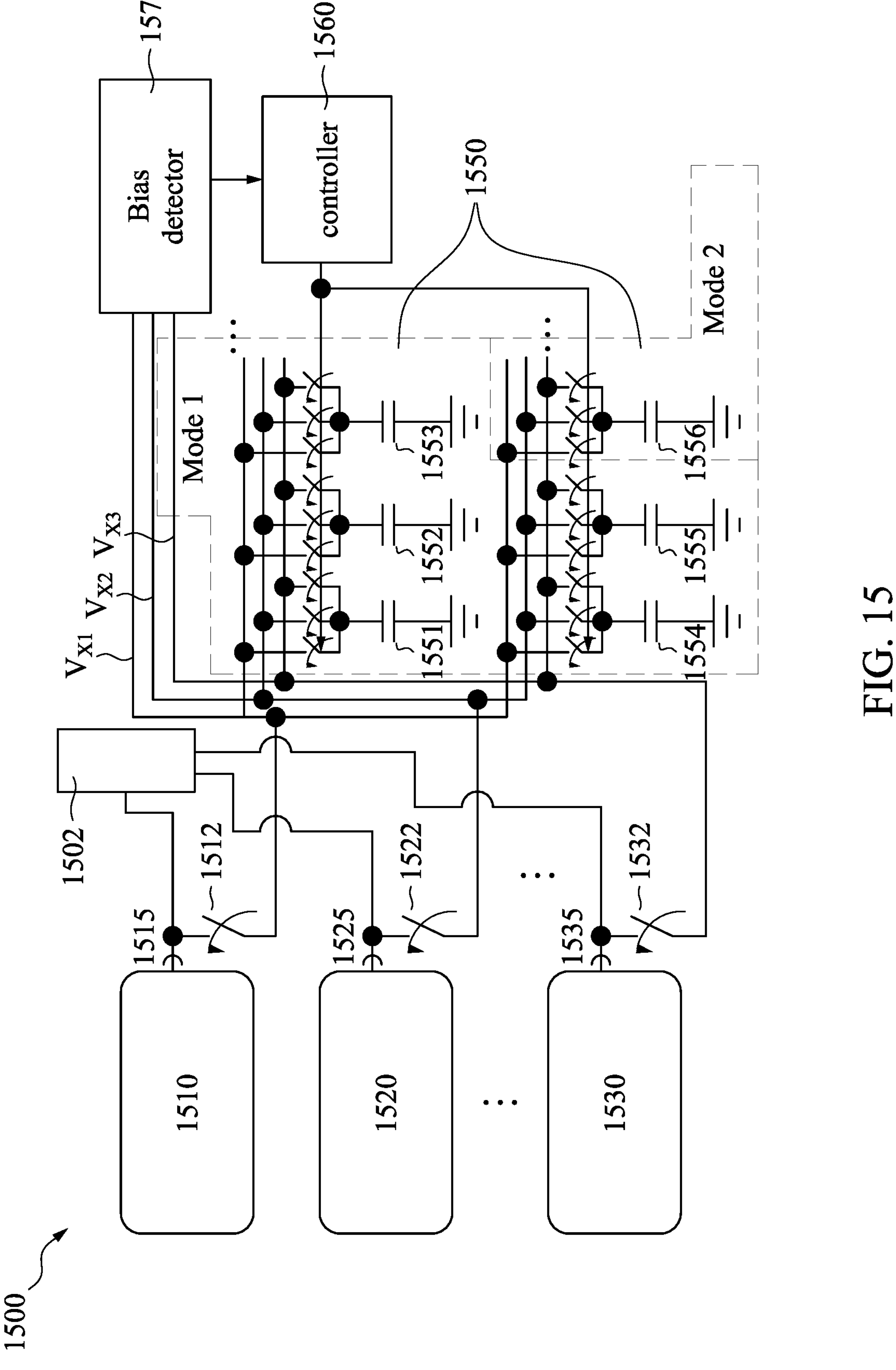
FIG. 15 illustrates an example block diagram of yet another memory device, in accordance with some embodiments.

FIG. 15 illustrate a block diagram of yet another example memory device 1500, in accordance with various embodiments. In some aspects of the present disclosure, the memory device 1500 includes a plural number of voltage regulators (e.g., LDO voltage regulators) sharing a common decoupling capacitor that has a configurable (e.g., codable or programmable) amount of capacitance. Specifically, the memory device 1500 is substantially similar to the memory device 1300 (FIG. 13), except that the memory device 1500 further includes a bias detector operatively coupled to a controller that can individually control an amount of decoupling capacitance for each operation mode of the corresponding memory macro. It should be understood that the block diagram of FIG. 15 is simplified, and thus, the memory device 1500 can include any of various other components while remaining within the scope of the present disclosure.

For example, the memory device 1500 includes a memory macro 1502, a first voltage regulator 1510, a second voltage regulator 1520, a third voltage regulator 1530, a first switch 1512, a second switch 1522, a third switch 1532, and a shared decoupling capacitor 1550 that includes a plural number of sub-capacitors, e.g., 1551, 1552, 1553, 1554, 1555, 1556, etc. Although three voltage regulators (and a corresponding number of switches) are shown, it should be understood that the memory device 1500 can include any number of the voltage regulators while remaining within the scope of the present disclosure. The memory macro 1502 includes one or more memory banks, each of the memory banks including one or more memory arrays (or sub-arrays), and each of the memory arrays including a plural number of memory cells. In various embodiments, each of the memory cells is implemented as being applied with more than two voltage levels for respective operation modes. For example, the memory cell may be a resistive random access memory (RRAM) cell or a magnetoresistive random access memory (MRAM) cell that can be programmed (written) with a first operation voltage, read with a second operation voltage, or operated with a third operation voltage. The operation voltages are different from each other.

In the embodiment of FIG. 15, each of the sub-capacitors 1551 to 1556 is coupled to three switches that correspond to the first, second, and third operation modes, respectively. A number of such switches can correspond to a number of the operation modes of the memory macro 1502. The memory device 1500 further includes a controller 1560 that can redistribute respective amounts of decoupling capacitance for different operation modes of the memory macro 1502 by controlling the three switches (hereinafter "first redistribution switch," "second redistribution switch," and "third redistribution switch"). When the memory macro 1502 is configured in a first operation mode, the first voltage regulator 1510 is activated and the first switch 1512 is turned on. The controller 1560 can control a number of the first redistribution switches to be turned on. When the memory macro 1502 is configured in a second operation mode, the second voltage regulator 1520 is activated and the second switch 1522 is turned on. The controller 1560 can control a number of the second redistribution switches to be turned on. For example in FIG. 15, the controller 1560 can turn on the first redistribution switches (and turn off the second and third redistribution switches) for the sub-capacitors 1551 to 1555 for coupling an output node of the first voltage regulator 1510 to ground through the sub-capacitors 1551 to 1555; and the controller 1560 can turn on the second redistribution switch (and turn off the first and third redistribution switches) for the sub-capacitor 1556 for coupling an output node of the second voltage regulator 1520 to ground through the sub-capacitor 1556.

Further, the memory device 1500 includes a bias detector 1570 that can dynamically monitor a voltage received by the memory macro 1502 from each of the voltage regulators 1510 to 1530, e.g., Vx1, Vx2, and Vx3, respectively. Continuing with the above example, during a first period of time, the controller 1560 allocates the sub-capacitors 1551 to 1554 as the decoupling capacitance for the first voltage regulator 1510 (the first operation mode), and the sub-capacitor 1555 to 1556 as the decoupling capacitance for the second voltage regulator 1520 (the second operation mode). Following such a configuration, the first operation mode may gradually consume more power and the second operation mode may gradually consume less power. Accordingly, the bias detector 1570 may identify such increasing Vx1 and decreasing Vx2. In response, during a second period of time, the bias detector 1570 may cause the controller 1560 to adjust the respective amounts of decoupling capacitance for the first voltage regulator 1510 and second voltage regulator 1520. For example, the controller 1560 may increase the decoupling capacitance for the first voltage regulator 1510 and reduce the decoupling capacitance for the second voltage regulator 1520 by reallocating the sub-capacitor 1555 for the first operation mode, as shown in FIG. 15.

Figure 16:
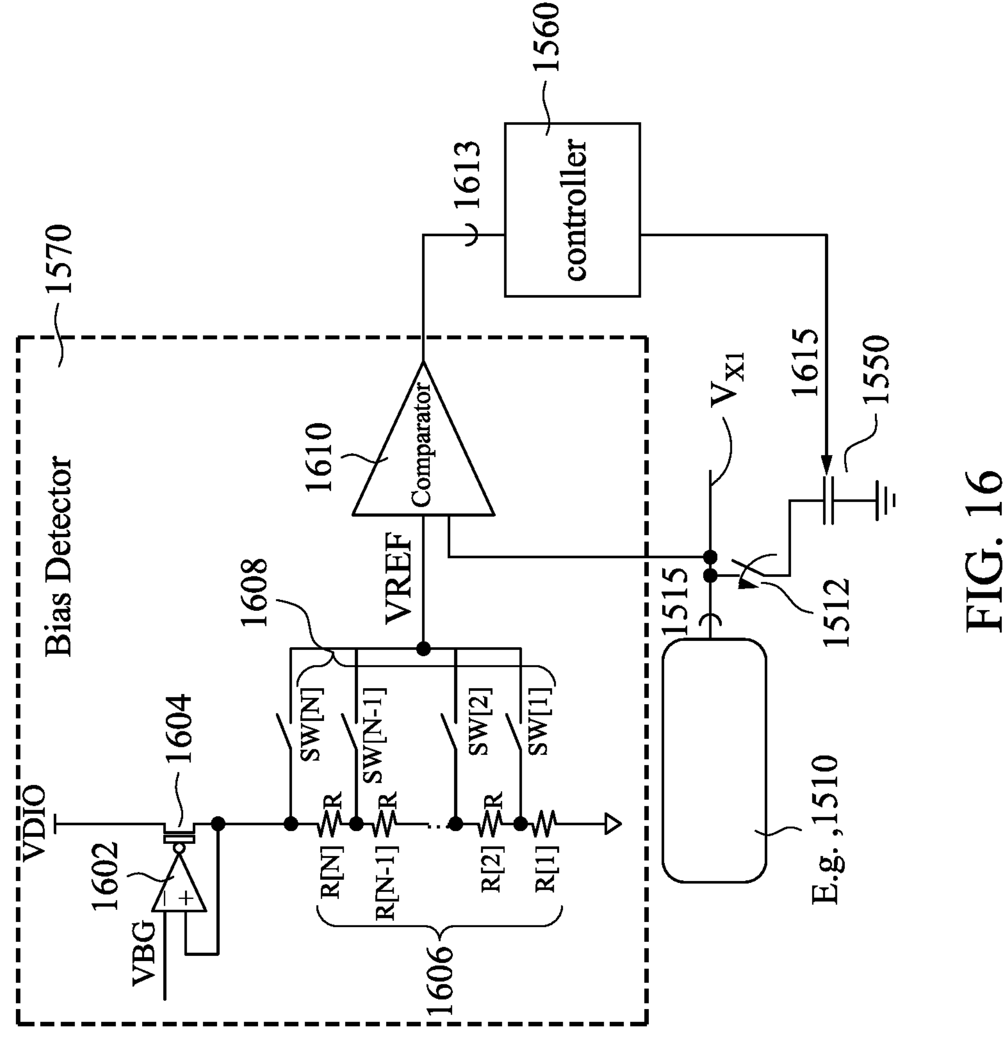
FIG. 16 illustrates an example circuit diagram of a bias detector of the memory device shown in FIG. 15, in accordance with some embodiments.

FIG. 16 illustrates an example circuit diagram of the bias detector 1570, in accordance with various embodiments. As shown, the bias detector 1570 includes an amplifier 1602, a PMOS transistor 1604, a number of resistors 1606 (serving as a voltage divider), a number of switches 1608 (controlling the resistors 1606), and a comparator 1610. In the illustrated example of FIG. 16, the bias detector 1570 is coupled to one of the voltage regulators, e.g., 1510, with the decoupling capacitor 1550 coupling an output node of the voltage regulator 1510 to ground. In some embodiments, the comparator 1610 (of the bias detector 1570) can compare a reference voltage (VREF) output by the voltage divider 1606 with the voltage Vx1 received by the memory macro 1502. Based on the comparison, the comparator 1610 can output a signal 1613 to cause the controller 1560 to output a signal 1615. The signal 1615 may include decoded information corresponding to a respective combination of the redistribution switches for each of the sub-capacitors (of the decoupling capacitor 1550). Consequently, a corresponding amount of the decoupling capacitance can be coupled to the output node of the voltage regulator 1510.

Figure 17:
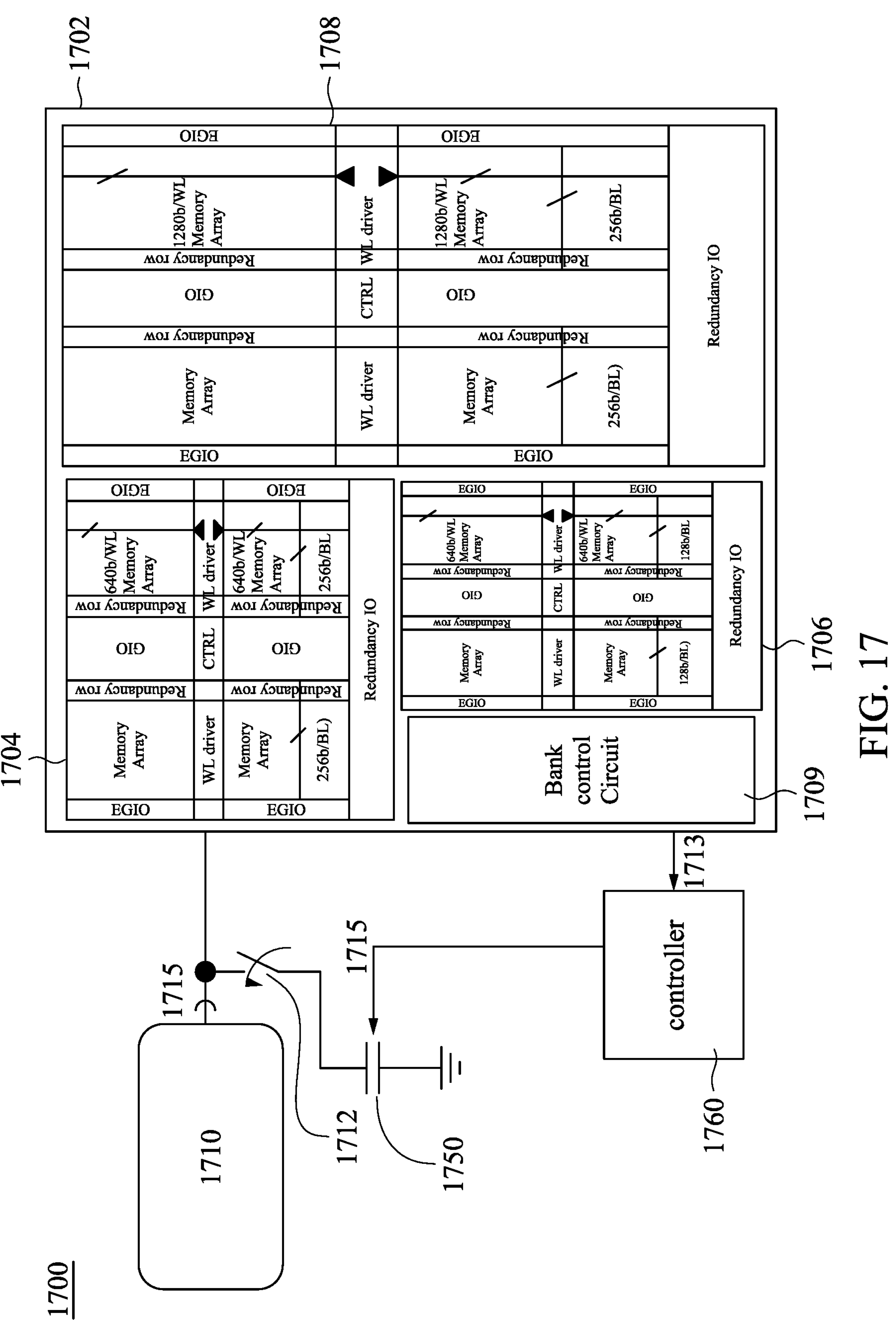
FIG. 17 illustrates an example block diagram of yet another memory device, in accordance with some embodiments.

FIG. 17 illustrate a block diagram of yet another example memory device 1700, in accordance with various embodiments. In some aspects of the present disclosure, the memory device 1700 includes a plural number of voltage regulators (e.g., LDO voltage regulators) sharing a common decoupling capacitor that has a configurable (e.g., codable or programmable) amount of capacitance. Specifically, the memory device 1700 is substantially similar to the memory device 1300 (FIG. 13), except that a memory macro of the memory device 1700 includes a plural number of memory banks with respectively different sizes or configurations. It should be understood that the block diagram of FIG. 17 is simplified, and thus, the memory device 1700 can include any of various other components while remaining within the scope of the present disclosure.

For example, the memory device 1700 includes a memory macro 1702, a voltage regulator 1710, a switch 1712, a shared decoupling capacitor 1750 that includes a plural number of sub-capacitors, and a controller 1760. Although one voltage regulator (and a corresponding number of switches) is shown, it should be understood that the memory device 1700 can include any number of the voltage regulators while remaining within the scope of the present disclosure. The decoupling capacitor 1750 and controller 1760 are substantially similar to the decoupling capacitor 1350 and controller 1360 discussed above, respectively, and thus, the corresponding description is not repeated.

In the illustrated embodiment of FIG. 17, the memory macro 1702 includes a plural number of memory banks, e.g., 1704, 1706, and 1708, etc., each of the memory banks including one or more memory arrays (or sub-arrays), and each of the memory arrays including a plural number of memory cells. The memory banks 1704 to 1708 can have respective configurations or sizes, e.g., a respective number of memory arrays, a respective length of bit lines, a respective length of word lines, etc. In various embodiments, each of the memory cells is implemented as being applied with plural voltage levels for respective operation modes. For example, the memory cell may be a resistive random access memory (RRAM) cell or a magnetoresistive random access memory (MRAM) cell that can be programmed (written) with a first operation voltage, or read with a second operation voltage. The operation voltages are different from each other.

Based on the respective configurations of the memory banks, a bank control circuit 1709 can provide a signal 1713 to the controller 1760. In some embodiments of the present disclosure, in the signal 1713, the bank control circuit 1709 can indicate which memory bank in the macro 1702 has been selected, or a configuration of the selected memory bank. Based on the signal 1713, the controller 1760 can output a signal 1715 to control (or adjust) a respective amount of decoupling capacitance for each of the memory banks. For example, if a smaller memory bank (e.g., 1706) has been selected, the controller 1760 may increase an amount of the decoupling capacitance (of the decoupling capacitor 1750). On the other hand, if a larger memory bank (e.g., 1702) has been selected, the controller 1760 may decrease an amount of the decoupling capacitance (of the decoupling capacitor 1750).

Figure 18:
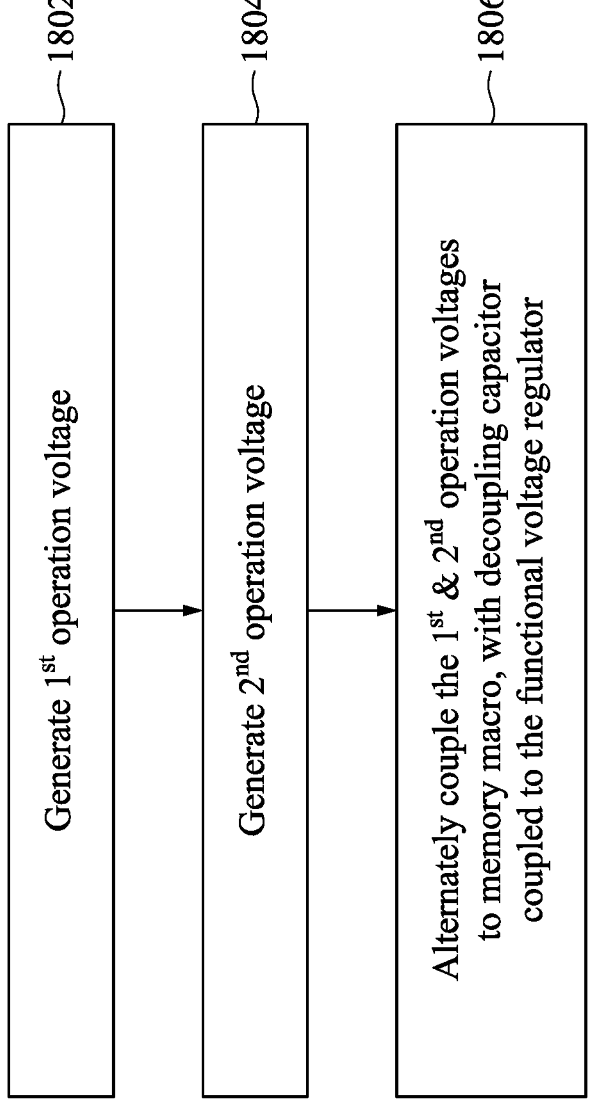
FIG. 18 is an example flow chart of a method for operating a memory device, in accordance with some embodiments.

FIG. 18 illustrates a flow chart of an example method 1800 for operating a memory device, in accordance with various embodiments. The method 1800 may be used to operate a memory device including a memory macro and a plural number of voltage regulators, operatively coupled to the memory macro, in which the voltage regulators share a decoupling capacitor. For example, at least some of the operations described in the method 1800 can operate any of the memory device 100 (FIG. 1), 400 (FIG. 4), 500 (FIG. 5), 600 (FIG. 6), 700 (FIG. 7), 900 (FIG. 9), 1300 (FIG. 13), 1500 (FIG. 15), or 1700 (FIG. 17). It is noted that the method 1800 is merely an example and is not intended to limit the present disclosure. Accordingly, it is understood that additional operations may be provided before, during, and after the method 1800 of FIG. 18, and that some other operations may only be briefly described herein.

The method 1800 starts with operation 1802 in which a first operation voltage is generated by a first one of a number of voltage regulators coupled to a memory macro. Using the memory device 100 of FIG. 1 as a representative example, the first voltage regulator 110 can generate the first operation voltage 115. In some embodiments, the first voltage regulator 110 may be activated (to generate the first operation voltage 115) when the coupled memory macro 102 is configured to operate under a first operation mode.

The method 1800 continues to operation 1804 in which a second operation voltage is generated by a second one of the voltage regulators coupled to the memory macro. Continuing with the above example, the second voltage regulator 120 can generate the second operation voltage 125. In some embodiments, the second voltage regulator 120 may be activated (to generate the second operation voltage 125) when the coupled memory macro 102 is configured to operate under a second operation mode. In some embodiments, the first operation voltage 115 may be different from the second operation voltage 125.

The method 1800 continues to operation 1806 in which the first operation voltage and the second operation voltage are alternately coupled to the memory macro, with a decoupling capacitor coupled to an output node of the functional voltage regulator. Continuing with the above example, the first voltage regulator 110 and the second voltage regulator 120 are alternately coupled to the memory macro 102. Further, when the memory macro 102 is configured in the first operation mode, a first switch (e.g., 112) is turned on and an output node of the first voltage regulator 110 is further coupled to ground through the decoupling capacitor 150; and when the memory macro 102 is configured in the second operation mode, a second switch (e.g., 122) is turned on and an output node of the second voltage regulator 120 is further coupled to ground through the decoupling capacitor 150.

In one aspect of the present disclosure, a circuit is disclosed. The circuit includes a memory macro comprising a plurality of memory banks; a first voltage regulator configured to provide a first operation voltage to the memory macro at a first output node; a second voltage regulator configured to provide a second operation voltage to the memory macro at a second output node, wherein the second operation voltage is substantially higher than the first operation voltage; and a decoupling capacitor configured to be alternately shared by the first voltage regulator when the memory macro receives the first operation voltage, and by the second voltage regulator when the memory macro receives the second operation voltage.

In another aspect of the present disclosure, a circuit is disclosed. The circuit includes a memory macro comprising a plurality of memory banks, wherein the memory macro includes at least a first operation mode and a second operation mode; a first voltage regulator configured to provide a first operation voltage to the memory macro when the memory macro is configured at the first operation mode; a second voltage regulator configured to provide a second operation voltage to the memory macro when the memory macro is configured at the second operation mode, wherein the second operation voltage and the first operation voltage have respectively different voltage levels; and a decoupling capacitor configured to be alternately coupled to the first voltage regulator when the memory macro is configured at the first operation mode, and to the second voltage regulator when the memory macro is configured at the second operation mode.

In yet another aspect of the present disclosure, a method for operating a memory devices is disclosed. The method includes generating a first operation voltage through a first voltage regulator. The method includes generating a second operation voltage through a second voltage regulator. The method includes alternately coupling the first operation voltage and the second operation voltage to a memory macro. A single decoupling capacitor is coupled to the first voltage regulator when the memory macro is configured to receive the first operation voltage, and coupled to the second voltage regulator when the memory macro is configured to receive the second operation voltage.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a memory macro comprising a plurality of memory banks;
a first voltage regulator configured to provide a first operation voltage to the memory macro at a first output node;
a second voltage regulator configured to provide a second operation voltage to the memory macro at a second output node, wherein the second operation voltage is higher than the first operation voltage; and
a decoupling capacitor configured to be alternately shared by the first voltage regulator when the memory macro receives the first operation voltage, and by the second voltage regulator when the memory macro receives the second operation voltage, wherein the decoupling capacitor is configured to switch between directly coupling the first output node of the first voltage regulator to ground and directly coupling the second output node of the second voltage regulator to the ground;
wherein the first output node is selectively coupled to the ground through a first switch and the decoupling capacitor, and the second output node is selectively coupled to the ground through a second switch and the decoupling capacitor.

2. The circuit of claim 1,
wherein the first switch is turned on and the second switch turned off, for the memory macro to receive the first operation voltage, and wherein the second switch is turned on and the first switch turned off, for the memory macro to receive the second operation voltage.

3. The circuit of claim 1, further comprising:

a switch configured to selectively couple only the second output node to the decoupling capacitor;

wherein the switch is turned on for the memory macro to receive the second operation voltage, and turned off for the memory macro to receive the first operation voltage.

4. The circuit of claim 3, wherein the first voltage regulator is turned off when the switch is turned on.

5. The circuit of claim 1, wherein the first voltage regulator is coupled to a first supply voltage and a second supply voltage, the first supply voltage being higher than the second supply voltage; and the second voltage regulator is coupled to a third supply voltage and a fourth supply voltage, the third supply voltage being higher than the fourth supply voltage; and wherein the decoupling capacitor is coupled between the first supply voltage and the second output node of the second voltage regulator.

6. The circuit of claim 5, further comprising:

a first switch coupling the first supply voltage to the decoupling capacitor; and a second switch coupling the second output node to the decoupling capacitor;

wherein the first switch is turned on, with the second switch turned off, for the memory macro to receive the first operation voltage, and the second switch is turned on, with the first switch turned off, for the memory macro to receive the second operation voltage.

7. The circuit of claim 1, wherein the first voltage regulator is coupled to a first supply voltage and a second supply voltage, the first supply voltage being higher than the second supply voltage; and the second voltage regulator is coupled to a third supply voltage and a fourth supply voltage, the third supply voltage being higher than the fourth supply voltage; and wherein the decoupling capacitor is coupled between the first supply voltage and the fourth supply voltage.

8. The circuit of claim 7, further comprising:

a first switch coupling the first supply voltage to the decoupling capacitor; and a second switch coupling the fourth supply voltage to the decoupling capacitor;

wherein the first switch is turned on, with the second switch turned off, for the memory macro to receive the first operation voltage, and the second switch is turned on, with the first switch turned off, for the memory macro to receive the second operation voltage.

9. The circuit of claim 1, wherein, when in a write mode, the memory macro receives the first operation voltage, and when, in a read mode, the memory macro receives the second operation voltage.

10. The circuit of claim 1, further comprising a reset logic coupling between the memory macro and each of the first and second voltage regulators.

11. The circuit of claim 10, wherein the reset logic is configured to adjust a voltage received by the memory macro to ground, subsequently to the memory macro receiving the first operation voltage and prior to the memory macro receiving the second operation voltage.

12. The circuit of claim 1, wherein the decoupling capacitor comprises a plurality of sub-capacitors, and wherein a first number of the sub-capacitors coupling to the first output node, when the memory macro receives the first operation voltage, is identical to a second number of the sub-capacitors coupling to the second output node, when the memory macro receives the second operation voltage.

13. The circuit of claim 1, wherein the decoupling capacitor comprises a plurality of sub-capacitors, and wherein a first number of the sub-capacitors coupling to the first output node, when the memory macro receives the first operation voltage, is different from a second number of the sub-capacitors coupling to the second output node, when the memory macro receives the second operation voltage.

14. A circuit, comprising:

a memory macro comprising a plurality of memory banks, wherein the memory macro includes at least a first operation mode and a second operation mode;

a first voltage regulator configured to provide a first operation voltage to the memory macro when the memory macro is configured at the first operation mode;

a second voltage regulator configured to provide a second operation voltage to the memory macro when the memory macro is configured at the second operation mode, wherein the second operation voltage and the first operation voltage have respectively different voltage levels; and a decoupling capacitor configured to be alternately coupled to the first voltage regulator when the memory macro is configured at the first operation mode, and to the second voltage regulator when the memory macro is configured at the second operation mode, wherein the decoupling capacitor is configured to switch between directly coupling a first output node of the first voltage regulator to ground through a first switch and directly coupling a second output node of the second voltage regulator to the ground through a second switch.

15. The circuit of claim 14, wherein the first switch is turned on and the second switch turned off, when the memory macro is configured at the first operation mode, and the second switch is turned on and the first switch turned off, when the memory macro is configured at the second operation mode.

16. The circuit of claim 14, further comprising:

a switch configured to couple only the second voltage regulator to the decoupling capacitor;

wherein the switch is turned off when the memory macro is configured at the first operation mode, and turned on when the memory macro is configured at the second operation mode; and wherein the first voltage regulator is turned off when the switch is turned on.

17. The circuit of claim 14, wherein the first voltage regulator is coupled to a first supply voltage and a second supply voltage, the first supply voltage being higher than the second supply voltage; and the second voltage regulator is coupled to a third supply voltage and a fourth supply voltage, the third supply voltage being higher than the fourth supply voltage;

the circuit further comprises:

a first switch coupling the first supply voltage to the decoupling capacitor; and a second switch coupling the second output node of the second voltage regulator to the decoupling capacitor, wherein the first switch is turned on and the second switch turned off, when the memory macro is configured at the first operation mode, and the second switch is turned on and the first switch turned off, when the memory macro is configured at the second operation mode.

18. The circuit of claim 14, wherein the first voltage regulator is coupled to a first supply voltage and a second supply voltage, the first supply voltage being higher than the second supply voltage; and the second voltage regulator is coupled to a third supply voltage and a fourth supply voltage, the third supply voltage being higher than the fourth supply voltage, wherein the decoupling capacitor is coupled between the first supply voltage and the fourth supply voltage;

the circuit further comprises:

a first switch coupling the first supply voltage to the decoupling capacitor; and a second switch coupling the fourth supply voltage to the decoupling capacitor, wherein the first switch is turned on and the second switch turned off, when the memory macro is configured at the first operation mode, and the second switch is turned on and the first switch turned off, when the memory macro is configured at the second operation mode.

19. A method for operating a memory device, comprising:

generating a first operation voltage through a first voltage regulator;

generating a second operation voltage through a second voltage regulator; and alternately coupling the first operation voltage and the second operation voltage to a memory macro;

wherein a single decoupling capacitor is configured to couple the first voltage regulator directly to ground through a first switch when the memory macro is configured to receive the first operation voltage, and configured to couple the second voltage regulator directly to the ground through a second switch when the memory macro is configured to receive the second operation voltage.

20. The method of claim 19, wherein the second operation voltage and the first operation voltage have respectively different voltage levels.

* * * * *